United States Patent [19]
Kamakura et al.

[11] Patent Number: 5,990,497
[45] Date of Patent: Nov. 23, 1999

[54] SEMICONDUCTOR LIGHT EMITTING ELEMENT, SEMICONDUCTOR LIGHT EMITTING DEVICE USING SAME ELEMENT

[75] Inventors: Takanobu Kamakura, Kitakyushu; Takafumi Nakamura, Munakata; Makoto Yamamura, Buzen; Yoshio Ariizumi; Kazuhiro Tamura, both of Kitakyushu; Shinichi Sanda, Nakatsu; Takumi Komoto, Yukuhashi; Yukio Watanabe, Yokohama, all of Japan

[73] Assignee: Kabushiki Kaisha Toshiba, Kawasaki, Japan

[21] Appl. No.: 08/920,003

[22] Filed: Aug. 29, 1997

[30] Foreign Application Priority Data

Aug. 31, 1996 [JP] Japan .................................. 8-248962

[51] Int. Cl.$^6$ .................................................. H01L 33/00
[52] U.S. Cl. ................................ 257/94; 257/96; 257/97; 257/99; 257/100; 257/627; 257/628
[58] Field of Search ................................ 257/99, 100, 94, 257/96, 97, 627, 628

[56] References Cited

U.S. PATENT DOCUMENTS 3,841,917 10/1974 Shannon ................................... 148/1.5
5,550,675 8/1996 Komatsu .................................. 359/514

*Primary Examiner*—William Mintel
*Attorney, Agent, or Firm*—Finnegan, Henderson, Farabow, Garrett & Dunner, L.L.P.

[57] ABSTRACT

A semiconductor light emitting element exhibiting a characteristic of deflected luminous intensity distribution, a semiconductor light emitting device capable of making, even when the element is off the center, a luminous center close to the center, and an element scribing method having a high element separation rate without causing a crack and chipping of pellet edges. The semiconductor light emitting element involves the use of a scribed pellet 10 into which a wafer including a semiconductor layer such as a luminous layer that is stacked on a compound semiconductor substrate inclined at 5° through 20° to a surface (100) in a orientation [011], is subjected to an element separation process by a scribing method.

12 Claims, 12 Drawing Sheets

CENTER ELECTRODE

DEVIATED ELECTRODE

| MOUNT DIRECTION | PELLET CLEAVAGE | | |
|---|---|---|---|
| | CRACKS CHIPPINGS | PELLET CLEAVAGE | TOTAL |
| INVENTION (REVERSED CUTTING DIRECTION) | 0/50 | 0/50 | 0/100 |
| PRIOR ART (NORMAL CUTTING DIRECTION) | 9/50 | 18/50 | 27/100 |

SEMICONDUCTOR LIGHT EMITTING ELEMENT, SEMICONDUCTOR LIGHT EMITTING DEVICE USING SAME ELEMENT

BACKGROUND OF THE INVENTION

The present invention relates generally to a semiconductor light emitting element, a semiconductor light emitting device including especially a semiconductor light emitting element for emerging deflected light beams exhibiting luminous characteristics blue through infrared-ray areas, and a method of manufacturing the semiconductor light emitting element.

A semiconductor light emitting device having a semiconductor light emitting element such as an LED (Light Emitting Diode), is used for an outdoor display lamp, a signboard, a traffic signal and a display for displaying operations and states of a variety of appliances.

FIG. 19 shows an example of a sectional structure of the prior art semiconductor light emitting element composed of an InGaAlP material group. This semiconductor light emitting element includes an n-GaAs substrate 1 on which a reflection layer 2 consisting of ten pairs of n-GaAs/n-$In_{0.5}Al_{0.5}P$, an n-$In_{0.5}(Ga_{0.3}Al_{0.7})_{0.5}P$ cladding layer 3, an n-$In_{0.5}Ga_{0.5}P$ active layer 4, a p-$In_{0.5}(Ga_{0.3}Al_{0.7})_{0.5}P$ cladding layer 5, a p-GaAlAs current diffused layer 6, a p-GaAs contact layer 7 in this sequence. Thereafter, an n-electrode (a substrate side electrode) 8 is provided under the semiconductor substrate, and a p-electrode (light emitting side electrode) 11 is provided on the p-GaAs contact layer 7. Thereafter, the whole is formed into pellets by dicing. In this case, a side surface of the pellet assumes a substantially perpendicular or trapezoidal shape corresponding to a configuration of a dicing blade.

FIG. 20 is a sectional view illustrating a semiconductor light emitting device as a product in which the prior art semiconductor light emitting element is employed. FIG. 21 shows a characteristic of a luminous intensity distribution when this semiconductor light emitting device emits the light.

A bed member 27 of a lead 25 including a bowl-like reflector 19 is die-bonded to the semiconductor substrate of a semiconductor light emitting element (a pellet) 10 by use of a conductive bonding agent 26 such as an Ag paste. Thereafter, the p-electrode 11 and a lead 29 are electrically connected through a bonding wire 28 such as an Au wire. Sealed thereafter in a bullet-like resin molded sealing member 30 composed of an epoxy resin are the bowl-like reflector 19, a part of the lead 15, the conductive bonding agent 26, the semiconductor light emitting element 10, the bed member 27, the bonding wire 28, and a part of the lead 29. This resin molded sealing member 30 has functions as a lens and as a member to protect the semiconductor light emitting element 10.

FIG. 21 shows a characteristic of the luminous intensity distribution of the semiconductor light emitting device molded with the bullet-like resin molded sealing member, wherein the axis of ordinate indicates a light intensity (an arbitrary value), and the axis of abscissa indicates a distribution angle of luminous intensity. Light beams from the semiconductor light emitting device are distributed substantially in symmetry in all directions from the center of the bullet-like lens.

Further, in a surface mount type LED lamp (hereinafter referred to as an SMD lamp) constructed such that the semiconductor light emitting element is mounted on an insulating substrate and sealed by transparent resin to form a package, the above semiconductor light emitting element can not be disposed at the center of a product (i.e., the center of the insulating substrate) in a presently prevailing size of 2×1.25 mm or 1.6×0.8 mm or in a smaller size than these sizes in terms of an assembly design.

For example, a central line L passing through the center of the semiconductor light emitting element 10 shown in FIG. 22, is disposed slightly offset from the central line (viz., the center of the product) of the insulating substrate 20 having a thickness of 0.5 mm. This semiconductor, light emitting element 10 is 0.3×0.3 mm in a pellet size. First and second electrode conductors 21 and 22 of the semiconductor light emitting element 10 are formed on the insulating substrate 20, and the semiconductor light emitting element 10 is bonded onto the second electrode conductor 22 by an Ag (silver) paste. The electrode 11 of the semiconductor light emitting element 10 is provided substantially at the center of the semiconductor light emitting element 10. Then, the electrode 11 and the first electrode conductor 21 are electrically connected to each other through an Au (gold) bonding wire 23. The semiconductor light emitting element 10, tips of the first and second electrode conductors 21, 22, and the bonding wire 23 are covered for protection with a housing, i.e., a transparent resin molded sealing member 24 composed of the epoxy resin.

Thus, the central line L of the semiconductor light emitting element is not coincident with a central line O of the insulating substrate. Hence in the prior art SMD lamp, the characteristic of the luminous intensity distribution based on the housing exhibits an asymmetrical characteristic with respect to the center of this product, a peak position of luminance deviates from the center of the product, and the luminance at the center of the product decreases (see FIG. 7A). In FIGS. 7A and 7B, the axis of abscissas indicates a position of the insulating substrate 20 (the center is a substrate center 0), and the axis of ordinates indicates a light intensity (an arbitrary value).

Further, the pellet size of the semiconductor light emitting element has hitherto been normally 300 μm×300 μm. This size leads to a reduced possibility of the pellet being cracked and cleaved due to an impact load when mounted and wire-bonded. However, if the pellet size is under 250 μm×250 μm, the pellet might easily be subjected to a mechanical damage when mounted, and especially a scribed pellet is conspicuous in terms of this damage.

A method of cutting a compound semiconductor wafer in the pellet-like shape has hitherto involved the use of a dicer for linearly cutting it while rotating a high speed cutter blade formed by embedding diamond particles into a resinous or metal disk. Over recent years, however, there has been used a scribing method defined as a method of cutting the compound semiconductor wafer, which is advantageous in terms of a unit price of the element and processwise as well. The scribing method is, however, a method of dividing into a pellet by applying an external force upon a scribing line, and therefore, the wafer must be small in thickness in order to obtain a good separation rate and a good pellet configuration. Further, what is indispensable for the scribing process might be sufficient examinations about, e.g., a cutting depth thereof and a selection of the surface on which to scribe.

The semiconductor light emitting device using the conventional semiconductor light emitting element described above, has the characteristic in which the luminous intensity distribution is asymmetric. Therefore, for instance, the light emitting device is attached to a road information plate provided just above the road, it is required that the light emitting device be attached with a slight inclination downward so that the center of the luminous intensity distribution is directed to a vehicle passing through. Further, another method requires a molding process of making a lens design such that the luminous intensity distribution is deflected as an asymmetric characteristic.

Moreover, the prior art semiconductor light emitting element is structured so that the pellet is obtained by dicing the wafer, the side surface of this pellet is etched enough to form a rough state of this surface. It is known that a light emitting efficiency is enhanced with such a structure. The etching process on the side surface, however, decreases a light emitting area (a pn-junction area) of the pellet, and the number of manufacturing steps increases, which problem might cause many disadvantages.

Furthermore, according to the scribing method in the prior art, the surface of a semiconductor crystal layer stacked on the substrate is scribed. In this case, if split into the element by applying the external force after being scribed, a separation rate thereof is as remarkably bad as approximately 70%. For the purpose of improving this rate, there is contrived, e.g., a scribing method of scribing it by increasing a pressure applied upon a scribing diamond needle to give a sufficient cut depth by scribing. When increasing the pressure exerted on the scribing diamond needles, a scribed damage spreads over the crystal surface, resulting in a damage that is twice through four times as large as the scribing line width. This damage might cause the crack and chipping of the edge of the pellet when divided into the element by applying the external force, which tends to lower reliability. Another problem is that the pellet is unable to take a neat configuration.

What is thinkable otherwise is a method of scribing the substrate crystal. A point to which the attention is paid about this method is a prediction that the scribing line on the side of the substrate as a starting point of separation when divided into the element by applying the external force, is more advantageous for the reason that the crystal layer stacked by an epitaxial growth, it can be considered, exhibits a high viscosity due to a good crystallinity with respect to the substrate crystal. There exists, however, only a typical scribing device as the one capable of monitoring just only the surface on which to scribe, and it is highly difficult to coincide the scribing line on the side of the substrate crystal with an element pattern on the side of the stacked semiconductor crystal layer.

Further, the compound semiconductor wafer that has hitherto generally been used is 200 μm–300 μm. Then, a planar configuration of the pellet separated from the wafer is substantially square, and a crosswise dimension (a length-of one side of the square) is also 200 μm–300 μm. Namely, a general shape of the conventional pellet is substantially a cube. When obtaining such a pellet by dividing the wafer, in the step of being into the pellet by applying the external force after executing the scribing process, the separation rate is quite low because of the thickness being substantially uniform and comparatively large for the crosswise dimension of the pellet, and, even if separated therefrom, an occurrence rate of the defect such as the chipping in the pellet enough to be unusable is not small.

SUMMARY OF THE INVENTION

It is a first object of the present invention to provide a semiconductor light emitting element capable of obtaining a characteristic of deflected luminous intensity distribution even when using a hitherto-used resin molded sealing member.

It is a second object of the present invention to provide a semiconductor light emitting device capable of making a luminous center close to a center of the device even if the semiconductor light emitting element deviates from the center of the device.

It is a third object of the present invention to provide a method of manufacturing a semiconductor light emitting element showing a high reliability and assuming a neat pellet configuration by providing and using a compound semiconductor scribing method by which pellet edges are not cracked and chipped.

According to a first aspect of the present invention, there is provided a semiconductor light emitting element comprising:

a luminous surface formed in a perpendicular direction of a pn-junction; and two pairs of face-to-face side surfaces;

wherein one of the two pairs of side surfaces have fixed inclination in the same direction to the perpendicular direction, and wherein a light emitting direction from said luminous surface deviates from a normal line to said luminous surface.

The present invention provides an element (pellet) of a semiconductor light emitting element, into which a wafer including a compound semiconductor layer such as a luminous layer that is stacked on a compound semiconductor substrate inclined at a predetermined angle in an orientation [011] to a surface (100), is subjected to an element separation process by a scribing method. A pair of side surfaces of the pellet of this semiconductor light emitting element are not inclined, whereas another pair of side surfaces adjacent thereto are inclined at a predetermined angle.

According to the second aspect of the present invention, there is provided a semiconductor light emitting device comprising:

a semiconductor light emitting element with a luminous surface formed in a perpendicular direction of a pn-junction; two pairs of face-to-face side surfaces; one of the two pairs of side surfaces having fixed inclination in the same direction to the perpendicular direction, and a light emitting direction from said luminous surface deviating from a normal line to said luminous surface, an insulating substrate having a pair of electrode conductors including an electrode member provided on a principal surface and a conductive member extending from said electrode member to a rear surface;

a bonding wire for electrically connecting a light emitting side electrode of said semiconductor light emitting element to said electrode member of said pair of electrode conductors; and a resin molded sealing member for sealing said semiconductor light emitting element, said electrode member and said bonding wire, wherein a luminous surface formed with said light emitting side electrode of said semiconductor light emitting element takes a rectangular shape, and said light emitting side electrode is disposed in a position deviating substantially more distant from other area on said luminous surface than said electrode member electrically connected to said bonding wire on said rectangular luminous surface.

A semiconductor light emitting device is thus constructed by use of this semiconductor light emitting element, thereby obtaining the device having a characteristic of deflected luminous intensity distribution. Further, the semiconductor light emitting device, in which the pellet is disposed in a position deviating from the center, is capable of making a luminous center close to the center of the device, and of thereby obtaining an excellent characteristic of luminous intensity distribution. The semiconductor light emitting element according to the present invention reduces the possibility of cracking and chipping of the edges of the pellet and forming stepped portions in section. The resulting semiconductor light emitting element exhibits an efficient configuration and high reliability.

According to the third aspect of the present invention, there is provided a method of manufacturing a semiconductor light emitting element, comprising the steps of:

forming scribing lines on a principal surface of a wafer composed of a semiconductor substrate having a principal surface that is inclined in a orientation [011] at 10–20 degrees to a surface (100), and of a luminous layer including an active layer having a pn-junction that is grown on said semiconductor substrate; and a step of dividing said wafer into a plurality of pellets by applying external forces along the scribing lines.

According to the method of the present invention, an element separation rate can be higher than by the prior art, and there is obtained the semiconductor light emitting element eliminating the possibility of cracking and chipping of the element edges and also stepped portions in section. The resulting semiconductor light emitting element exhibits an efficient configuration and high reliability.

DESCRIPTION OF THE PREFERRED EMBODIMENTS

Embodiments of the present invention will hereinafter be described with reference to the accompanying drawings.

Figure 1:
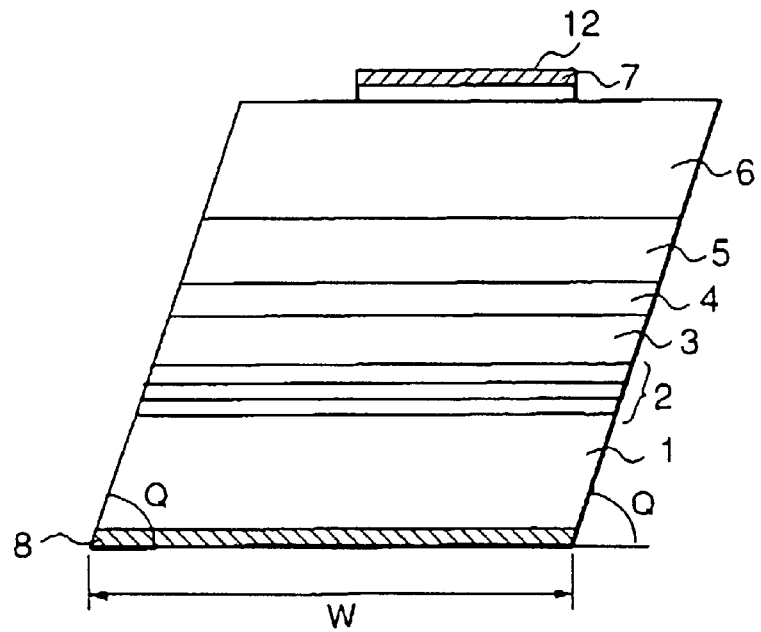
FIG. 1 is a sectional view illustrating a semiconductor light emitting element according to the present invention.

To start with, a first embodiment will be explained with reference to FIGS. 1 to 5. FIG. 1 is a sectional view illustrating a semiconductor light emitting element in the first embodiment.

This semiconductor light emitting element includes an n-GaAs substrate 1 on which to form a reflection layer 2 (0.7 $\mu$m in thickness) consisting of ten pairs of n-GaAs/n-In$_{0.5}$Al$_{0.5}$P, an n-In$_{0.5}$(Ga$_{0.3}$Al$_{0.7}$)$_{0.5}$P cladding layer 3 (0.6 $\mu$m in thickness), an n-In$_{0.5}$Ga$_{0.5}$P active layer 4 (0.3 $\mu$m in thickness), a p-In$_{0.5}$(Ga$_{0.3}$Al$_{0.7}$)$_{0.5}$P cladding layer 5 (0.6 $\mu$m in thickness), a p-GaAlAs current diffused layer 6 (4.5 $\mu$m in thickness), a p-GaAs contact layer 7 (0.7 $\mu$m in thickness) in this sequence. Thereafter, an n-electrode (a substrate side electrode) 8 is provided on the back surface of the semiconductor substrate, and a p-electrode (a light emitting side electrode) 12 is provided on the p-GaAs contact layer 7. Thereafter, the whole is formed into a pellet by scribing. At this time, a cutting/separating process is executed so that first pair of face-to-face side surfaces (right and left surfaces in FIG. 1) of the pellet are inclined ($\theta$) at 70°–85° to the substrate surface. Second pair of face-to-face side surfaces (front and rear surfaces in FIG. 1) of the pellet are, however, substantially at 90° to the substrate surface. The semiconductor light emitting element according to the present invention is manufactured in such a configuration that the pair of face-to-face side surfaces are inclined in the same direction by executing the cutting process described above. This semiconductor light emitting element is, when the active layer 4 is composed of n-In$_{0.5}$Ga$_{0.5}$P, luminous in red and is, when composed of nIn$_{0.5}$(Al$_{0.4}$Ga$_{0.6}$)$_{0.5}$P, luminous in green.

Figure 2:
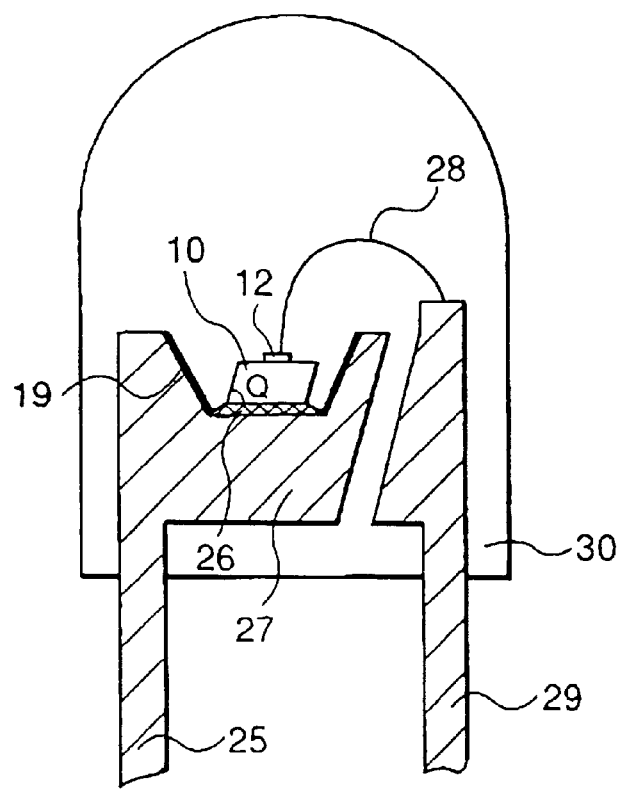
FIG. 2 is a sectional view illustrating a semiconductor light emitting device of the present invention.
Figure 3:
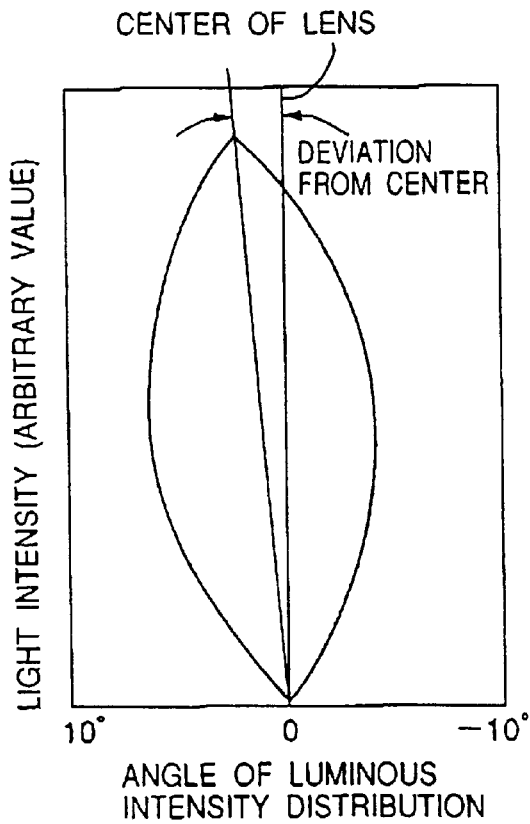
FIG. 3 is a characteristic diagram showing a dependency of a light intensity upon a luminous intensity distribution angle in the semiconductor light emitting device of the present invention.
Figure 21:
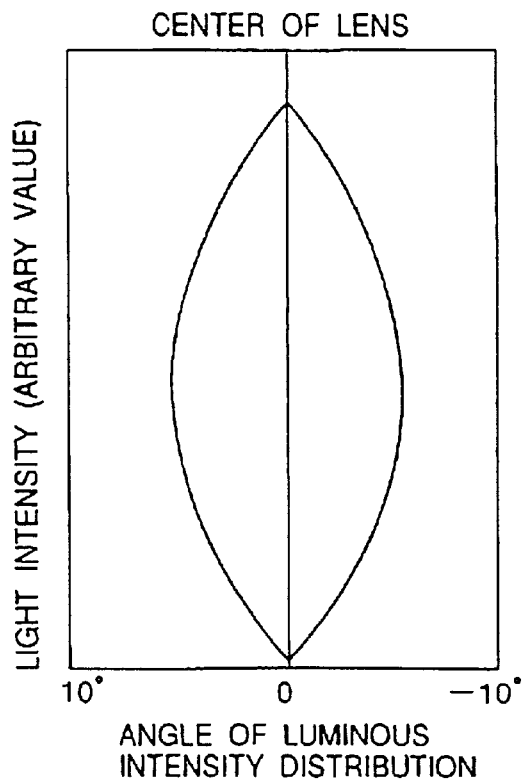
FIG. 21 is a characteristic diagram showing dependency of a light intensity upon a luminous intensity distribution angle in the prior art semiconductor light emitting device.
Figure 22A:
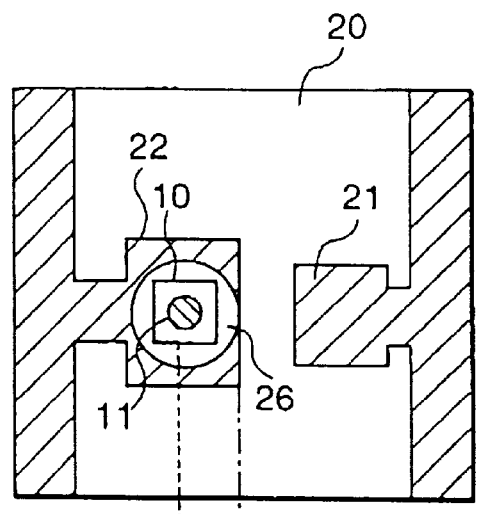
FIGS. 22A and 22B are plan and sectional views each showing a prior art surface mount type semiconductor light emitting device.
Figure 22B:
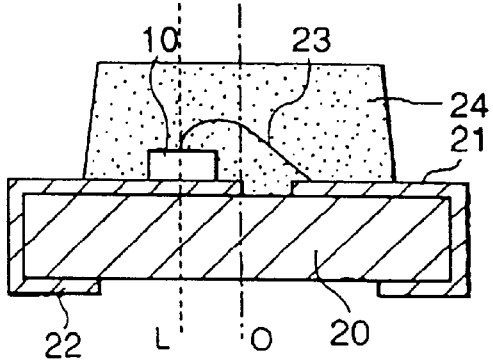

FIG. 2 is a sectional view showing a semiconductor light emitting device as a product in mounted with this pellet. FIG. 3 shows a characteristic of luminous intensity distribution when the semiconductor light emitting device emits the light. A semiconductor light emitting element pellet 10 on the substrate side is die-bonded to a bed member 27 connected to a lead 25 by use of a conductive bonding agent 26 such as an Ag paste. Thereafter, a bonding wire 28 such as an Au wire is bonded to a p-electrode 12 and to a lead 29 facing to the lead 25. These components are sealed in a resin molded sealing member 28 composed of an epoxy resin. The resin molded sealing member 28 assumes a bullet-like shape, and functions to protect the pellet as well as acting as a lens. The conventional semiconductor light emitting device shown in FIG. 21 exhibits an ordinary characteristic of luminous intensity distribution, while the semiconductor light emitting device in the first embodiment shown in FIG. 3 is capable of obtaining a characteristic of luminous intensity distribution of being slightly deflected from the center of a bullet-like lens thereof. A reason why deflected in terms of the characteristic of luminous intensity distribution may be such a point that a critical angle of the light emerging from the side surface differs on the face-to-face surfaces.

Figure 4:
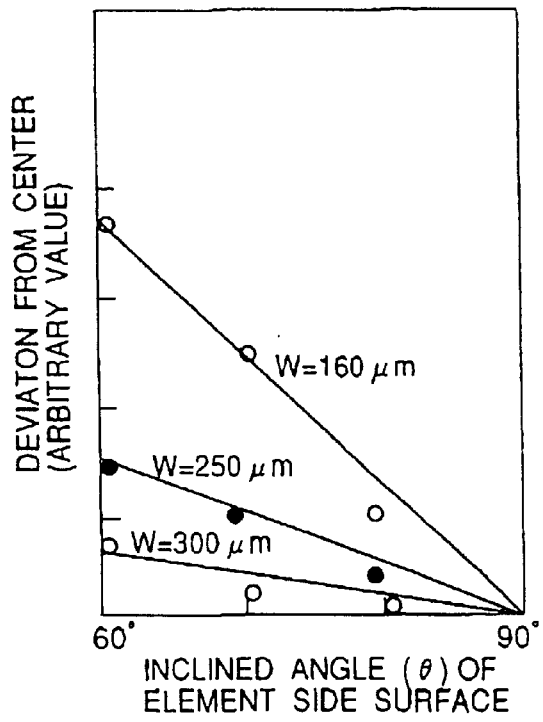
FIG. 4 is a characteristic diagram showing a characteristic of luminous intensity distribution in the semiconductor light emitting device of the present invention.

FIG. 4 is a characteristic diagram in which a relationship between a degree of deflection (a deviation from the center of the luminous intensity distribution) in the characteristic of the luminous intensity distribution and an angle of inclination and a pellet size. Therein, the axis of ordinate indicates a deviation (an arbitrary value) from the center of the lens of the semiconductor light emitting device, while the axis of abscissa indicates an inclination angle ($\theta$) showing the degree of inclination of the side surface of the pellet. The degree of deflection (an arbitrary value) increases as the inclination angle enlarges. Further, the deviation becomes large when reducing the pellet size (w).

Figure 5:
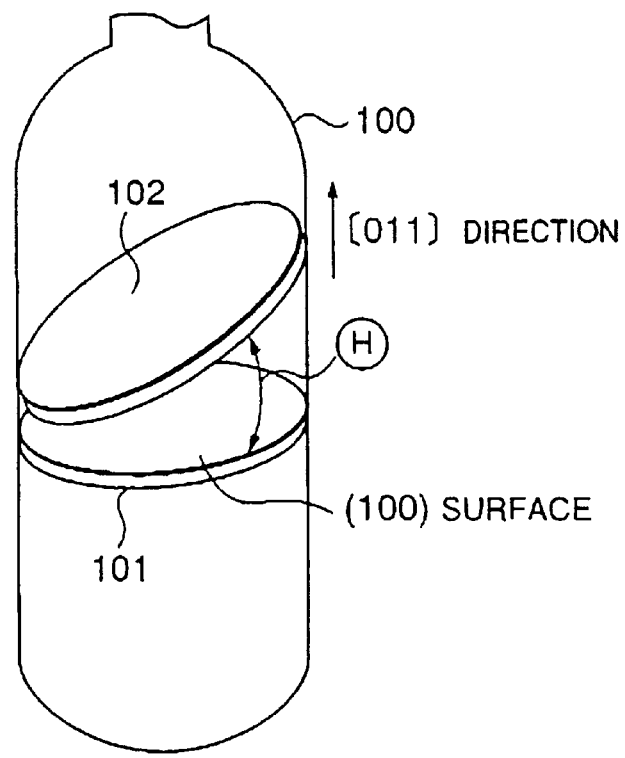
FIG. 5 is a perspective view illustrating an ingot from which a wafer is cut out.

It may involve a slicing process mating use of a surface orientation of the crystal that the surface of the semiconductor light emitting element according to the present invention has the inclination. FIG. 5 is an explanatory view showing a method of cutting a wafer out of a semiconductor monocrystalline ingot. An ingot 100 disposed perpendicularly is cut, thereby obtaining a wafer 101 having a surface (100). A direction of this cutting process is set inclined at 5–20° ($\theta=90-\theta$) to the surface (100) in a orientation [011], with the result that a wafer 102 having an inclination angle ($\theta$) of 70°–85° is to be cut out. A luminous layer is grown on a principal surface of the wafer 102, and a p/n electrode is formed thereto. Then, when implementing an element separation by the scribing method, there is formed the semiconductor light emitting element pellet, shown in FIG. 1, with the side surface inclined as a characteristic of the present invention. That to say, this pellet is, as described above, is constructed such that first face-to-face side surfaces of the pellet are inclined ($\theta$) at approximately 70°–85° to the substrate surface, and second face-to-face side surfaces of the pellet are substantially at 90° to the substrate surface.

Further, in accordance with the first embodiment, the semiconductor light emitting element of the InGaAlP group has been exemplified, however, semiconductor light emitting elements of a GaAlAs group and a GaP group may also be available.

Next, a second embodiment will be discussed with reference to FIGS. 6 and 7.

Figure 6A:
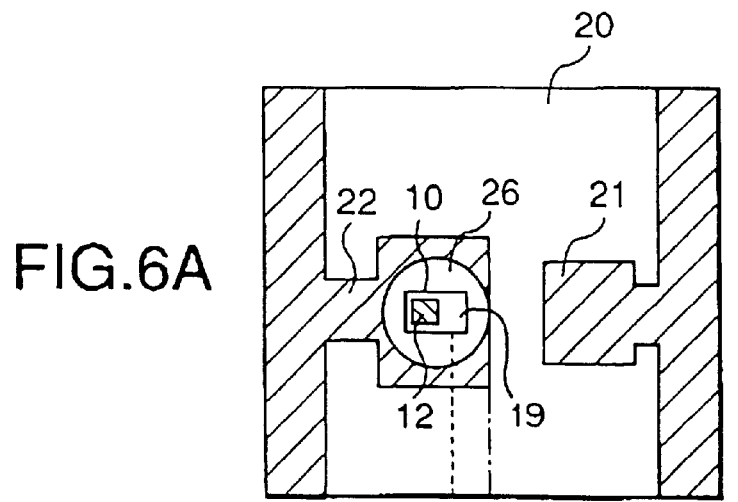
FIGS. 6A and 6B are plan and sectional views of a surface mount type semiconductor light emitting device of the present invention.
Figure 6B:
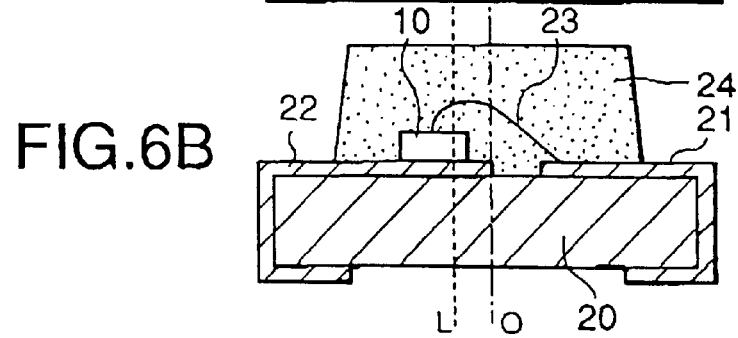
Figure 7A:
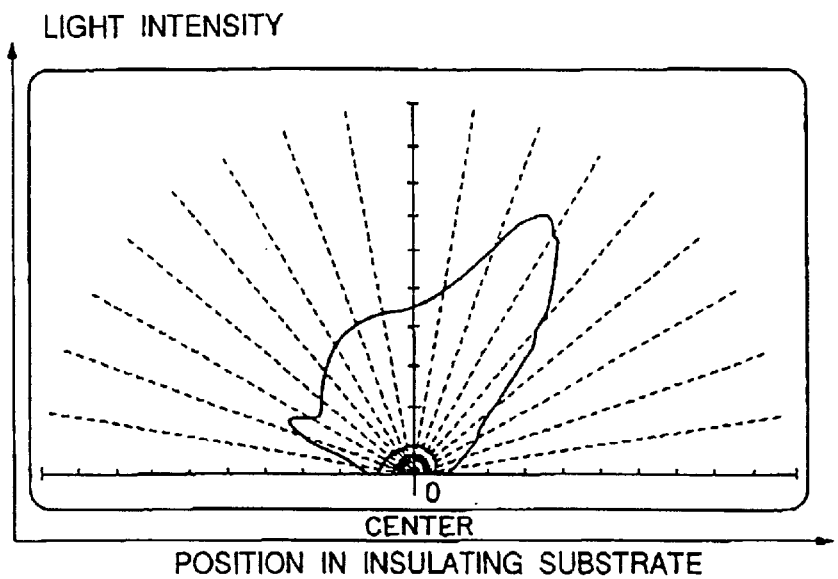
FIGS. 7A and 7B are explanatory characteristic diagrams each showing a characteristic of luminous intensity distribution in the surface mount type semiconductor light emitting device according to a center electrode type (FIG. 7A) and a deviated (offset) electrode type according to the present invention.
Figure 7B:
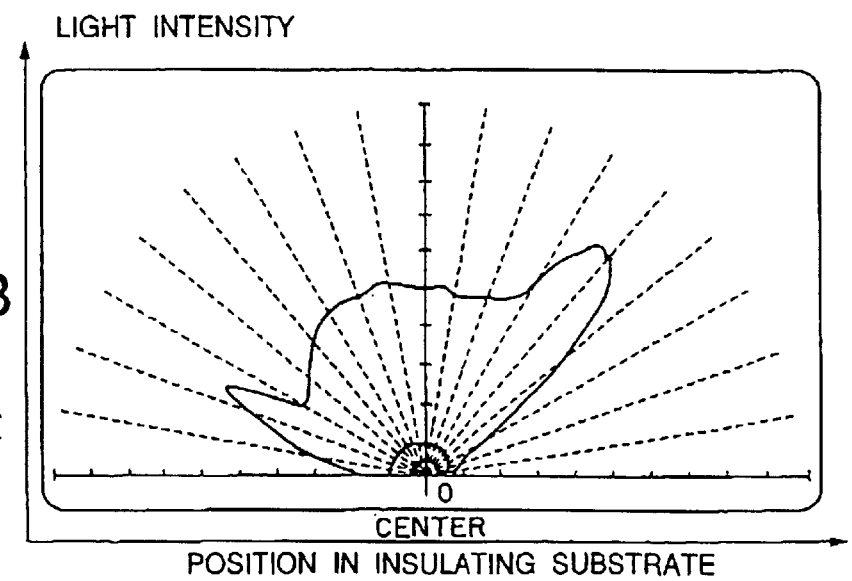

FIGS. 6A and 6B are a plan view and a sectional view of an SMD lamp mounted with an asymmetrical luminous semiconductor light emitting element used in the first embodiment of the present invention. FIG. 7B is a diagram showing a characteristic of luminous intensity distribution of the SMD lamp mounted with the asymmetrical luminous semiconductor light emitting element according to the present invention. A surface mount type LED lamp (an SMD lamp) having a size of 2×1.25 mm, will he explained in the second embodiment. A central line L (i.e., a luminous central line) passing through the center of a luminous area 19 of the semiconductor light emitting element 10 illustrated in FIGS. 6A and 6B, is disposed in a position slightly off a central line (viz., the center of a product) of an insulating substrate 20 having a thickness of 0.5 mm. This semiconductor light emitting element 10 is 0.2×0.15 mm in pellet size. First and second electrode conductors 21 and 22 for the semiconductor light emitting element 10 are formed on the insulating substrate 20. The semiconductor light emitting element 10 is bonded onto the second electrode conductor 22 by the Ag paste. The electrode 12 of the semiconductor light emitting element 10 is provided substantially at the center of the semiconductor light emitting element 10. Then, the electrode 12 and the first electrode conductor 21 are electrically connected to each other through a bonding wire 23 such as an Au wire. The semiconductor light emitting element 10, tips of the first and second electrode conductors 21, 22, and the bonding wire 23 are covered for protection with a housing, i.e., a transparent resin molded sealing member 24 composed of the epoxy resin.

Thus, in accordance with the second embodiment, a rectangular pellet is employed as a substitute for the-hitherto-square-shaped semiconductor light emitting element pellet, and the electrode 12 is disposed in the position deviating on one side on the rectangular luminous surface. Then, if the electrode 12 is disposed as far from the central line 0 of the insulating substrate 20 as possible, the luminous central line L of the luminous surface of the semiconductor light emitting element 10 is allowed to become more proximal to the central line O than by the prior art, although the central line L of the semiconductor light emitting element is not coincident with a central line O of the insulating substrate. A distance between this central line O and the luminous central line L was 0.25 mm in the prior art but was, in the second embodiment, reduced down to 0.17 mm.

Next, a third embodiment will hereinafter be described with reference to FIGS. 8 and 9.

Figures 8, 9:
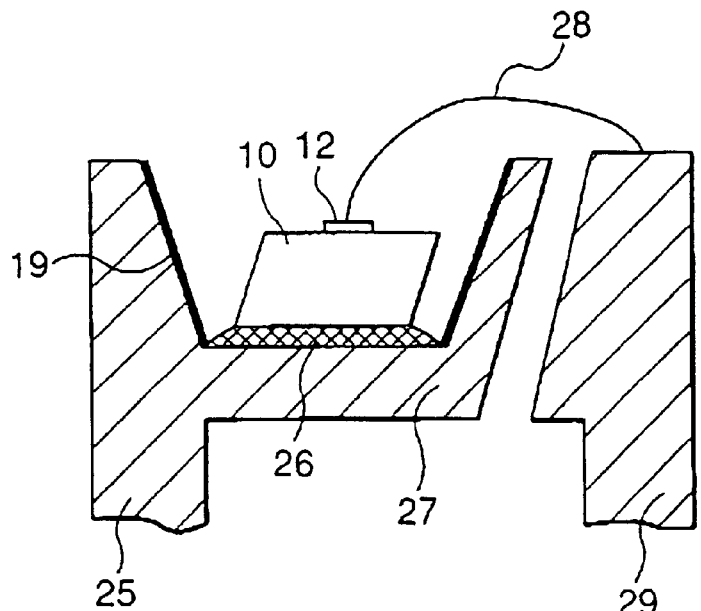
FIG. 8 is a partial sectional view of the semiconductor light emitting device of the present invention.
FIG. 9 is an explanatory table showing improvement of mechanical strength of a pellet according to the present invention by comparing to conventional pellets.

FIG. 8 is sectional view showing an LED lamp (a semiconductor light emitting device) in which the semiconductor light emitting element used in the first embodiment is mounted in a lead frame. FIG. 9 shows characteristics of the LED lamps by way of a comparative example between the present invention and the prior art. The semiconductor light emitting element pellet 10 is fixed to the head portion 27 of the lead frame composed of, e.g., an alloy of Fe-42%Ni by a conductive bonding agent 26 such as an Ag paste. The lead frame has a bowl-like reflector 19 so formed along the periphery of the head portion 27 as to surround the semiconductor light emitting element (the pellet) 10. The lead frame includes a pair of leads 25, 29. The lead 25 is connected to the reflector 19 and to the head portion 27, while the lead 29 is electrically connected to the electrode 12 by a bonding wire 28. The pellet 10, the bonding wire 28, the leads 25, 29 of the lead frame, the head portion 27 and the bowl-like reflector 19 are covered with a resin molded sealing member composed of, e.g., the epoxy resin. The pellet 10 is classified as a scribed pellet, and a surface, mounted on the lead frame, of the scribed pellet is formed with a scribing line for a wafer and is equal to a surface cut therefrom. Then, an inclined direction of the side surface of the pellet 10 is coincident with a direction in which the bonding wire 28 extends from the pellet 10 to be bonded to the lead 29 (a state of thus mounting the pellet 10 on the lead frame implies that a mounting direction is opposite (reversed) to a cutting direction of the wafer.). The conventional cutting process of the wafer (in the prior art) involves forming the scribing line on the luminous layer, and therefore the mounting direction is termed a cutting direction of the wafer. Some parts of the leads 25, 29 protrude outside from the resin molded sealing member. As shown in the table of FIG. 9, no occurrence of a defect has been observed when mounted.

Next, a fourth embodiment will be explained with reference to FIGS. 10 to 13.

Figure 10:
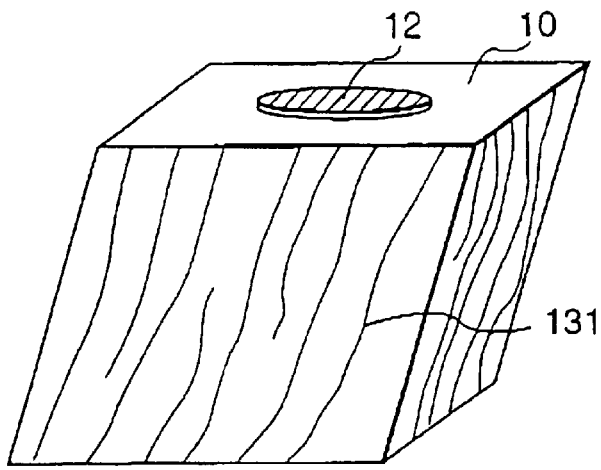
FIG. 10 is an explanatory perspective view showing a profile of the pellet according to the present invention.
Figures 11A, 11B:
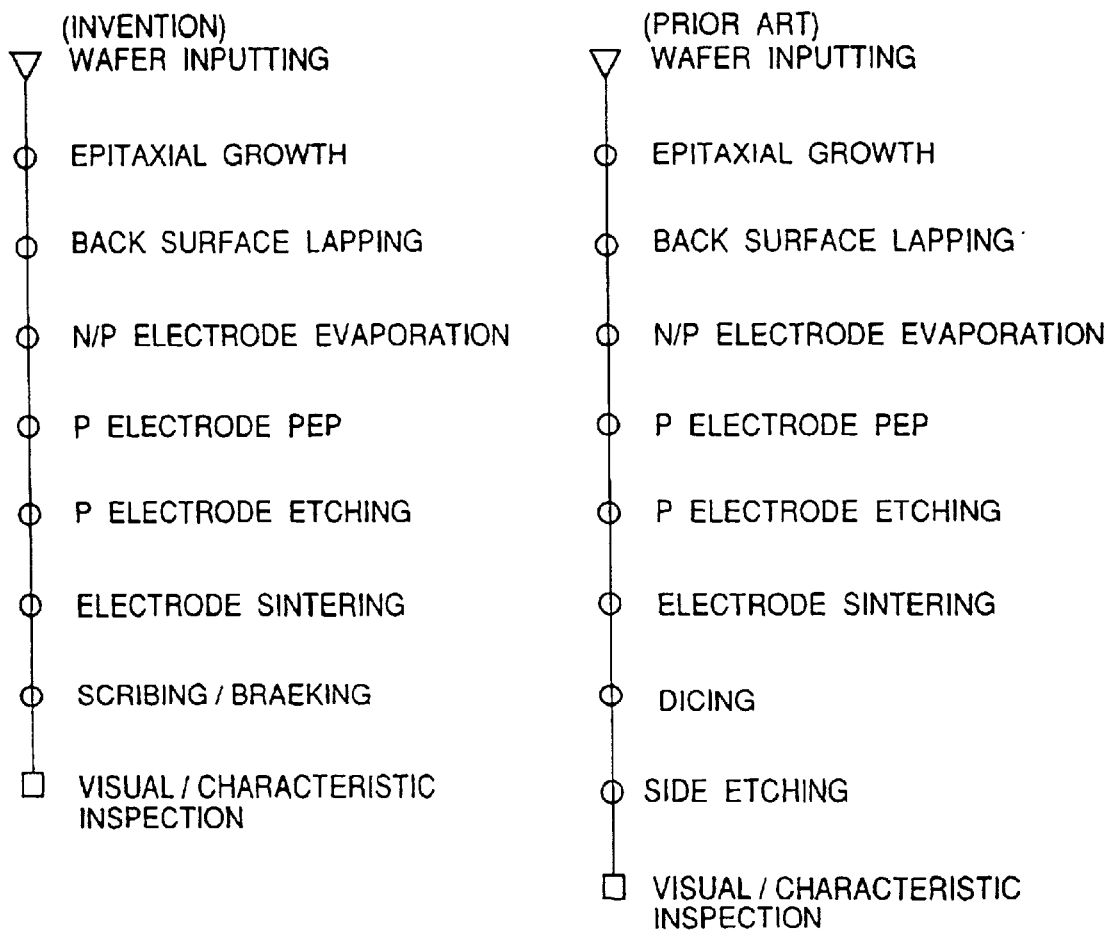
FIGS. 11A and 11B are explanatory flowcharts showing processes of manufacturing semiconductor light emitting elements according to the present invention and the prior art.
Figure 12:
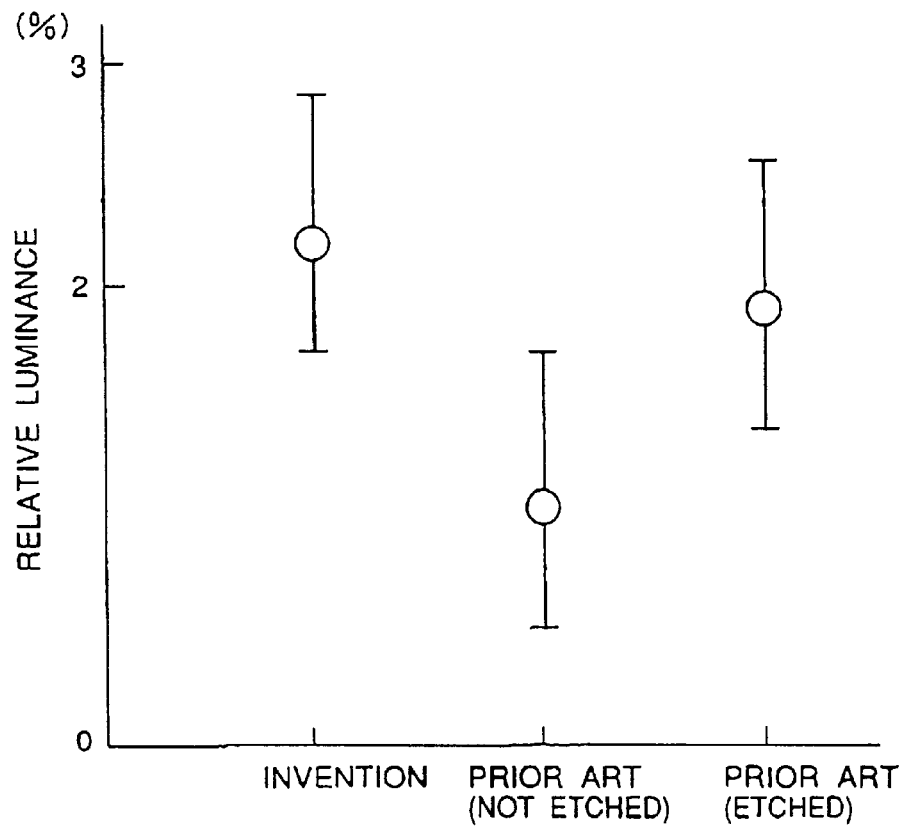
FIG. 12 is an explanatory characteristic diagram showing a relative luminance according to the present invention.
Figure 13:
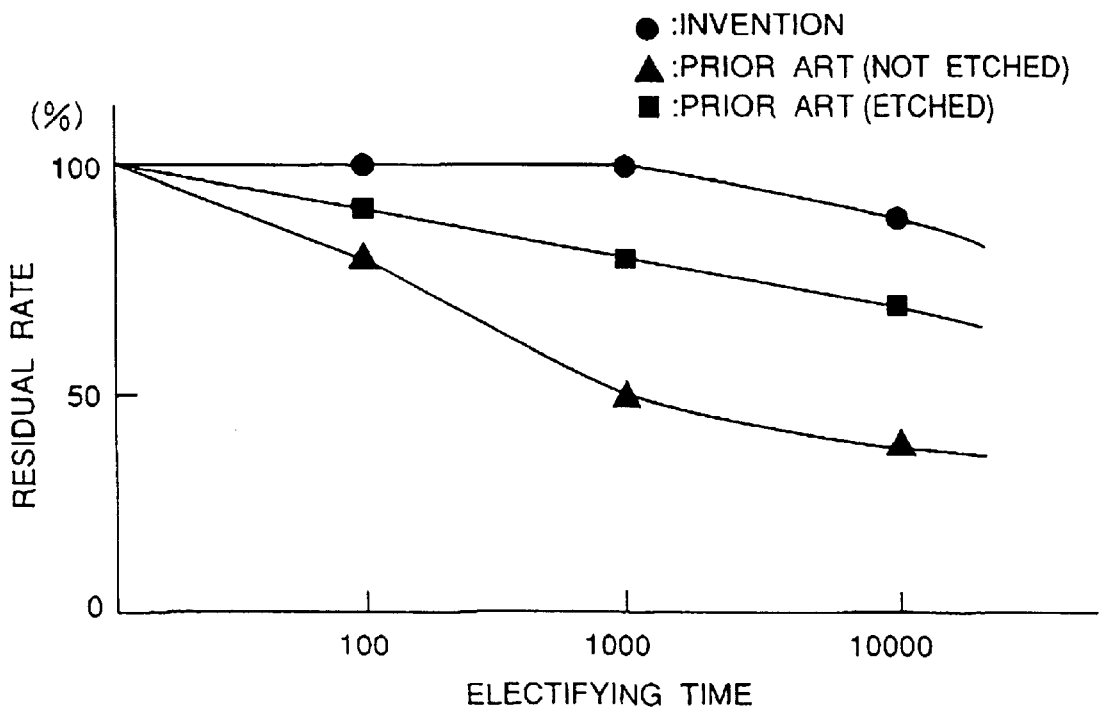
FIG. 13 is an explanatory diagram showing a residual rate (relative ratio of a luminous power after continual electrifying test to an initial luminous power) of the semiconductor light emitting element of the present invention.

FIG. 10 is a perspective view illustrating the semiconductor light emitting element. FIGS. 11A and 11B are flowcharts showing processes of manufacturing the semiconductors according to the present invention and the prior art. FIG. 12 is an explanatory characteristic diagram showing variations in relative luminances of the semiconductor light emitting elements according to the present invention and the prior art. FIG. 13 is a characteristic diagram showing dependencies of residual rates of the semiconductor light emitting elements upon an electrifying time according to the present invention and the prior art. The residual rate is defined as a relative ratio of a luminous power after continual electrifying test to an initial luminous power.

FIG. 10 is a perspective view illustrating a profile of the semiconductor light emitting element used in the semiconductor light emitting device show in FIG. 2, and an internal structure thereof is illustrated in FIG. 1.

The manufacturing processes of the semiconductor light emitting element will be at first explained with reference to FIG. 11. To begin with, a GaAs substrate is prepared (inputting of a wafer). A plurality of compound semiconductor layers constituting luminous layers including active layers are epitaxial-grown (an epitaxial growth) on the GaAs substrate by, e.g., a MOCVD (Metal Organic Chemical Vapor Deposition) method. Next, a rear surface of the GaAs substrate is lapped (a rear surface lapping process). An AuGe alloy as an N-type electrode is evaporated on the GaAs substrate. Further, a P-type electrode (an AuZn alloy) serving as an electrode is evaporated on the epitaxial layer (n/p electrode evaporation process). Next, the P-type electrode is petterned in a desired shape by use of the photolithography (PEP) and etching (a P-electrode PEP/P-electrode etching process).

Thereafter, a sintering process is carried out for several tens of minutes at approximately 450° in order to obtain an ohmic contact between the evaporated AuZn alloy and the semiconductor layer (an electrode sintering process). The element separation involves forming lattice-like scribing lines at a pitch of 300 μm or the substrate, applying a cutter blade on the scribing line and cutting it along a cleavage surface of the GaAs crystal (the scribing line is formed in parallel to a surface [110], thereby obtaining a pellet as illustrated in FIG. 10 (a scribing/breaking process). Thereafter, this pellet is placed and fixed to the frame shown in FIG. 2 by the Ag paste, and the semiconductor light emitting element is formed by executing resin molding after being connected by the bonding wire. Minute steps 131 in the pellet side surface, which characterizes the fourth embodiment, are formed during the scribing/breaking process for the element separation. A relationship between the line when scribed and a crystal orientation, a scanning speed, and a load are regulated, thereby adjusting a desired number of steps and a height of the step. A higher reproducibility is obtained by the control under the scribing condition so as not to change the number of steps and the height thereof under the condition during the breaking process.

The semiconductor light emitting element may be composed of an InGaAlP group material and may also be composed of a material such as GaAsP/GaP having a large light emerging surface area on the pellet side surface. Further, GaAlAs/GaAs group materials may also be available.

FIG. 12 shows a relative comparison in luminance when a forward current is 20 mA between the pellet in accordance with the fourth embodiment of the present invention the pellet based on the conventional structure and a conventionally-structured pellet with it side surfaces etched, which are each packaged with the same frame and the same resin. It can be understood that the pellet according to the present invention exhibits a higher luminance than by the prior art and is, when compared, superior to the pellet constructed to enhance the light emitting efficiency with the side surfaces etched. In the pellet according to the present invention, the element separation involves the use of the scribing/breaking method. Hence, no cutting allowance is needed as compared with the conventional dicing method, the number of pellets obtained out of a single piece of wafer is increased by 10% or above enough to supply the pellets at a low price. Moreover, a reliability of each of the above-described pellets is evaluated with reference to FIG. 13. This is an examination how the luminance changes when performing continual electrifying tests for 100 hours, 1,000 hours and 10,000 hours at a room temperature. The pellet based on the conventional structure deteriorates from a comparatively early stage, and exhibits a relative luminance of 50% or under after 1,000 hours. Each pellet is standardized with an initial luminance. The pellet in accordance with the embodiment of the present invention keeps a brightness of 85% or above even after 10,000 hours. This pellet has an extremely small quantity of deterioration in the luminance as compared with such a result that the pellet with the side surfaces etched exhibits a luminance on the order of 70%.

Figure 14A:
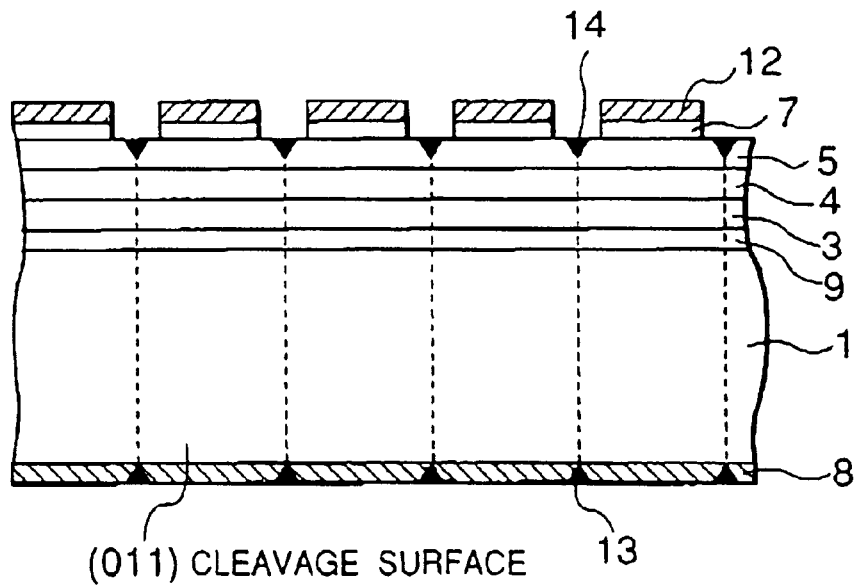
FIGS. 14A and 14B explanatory sectional views each sowing a method of cutting a wafer according to the present invention.
Figure 14B:
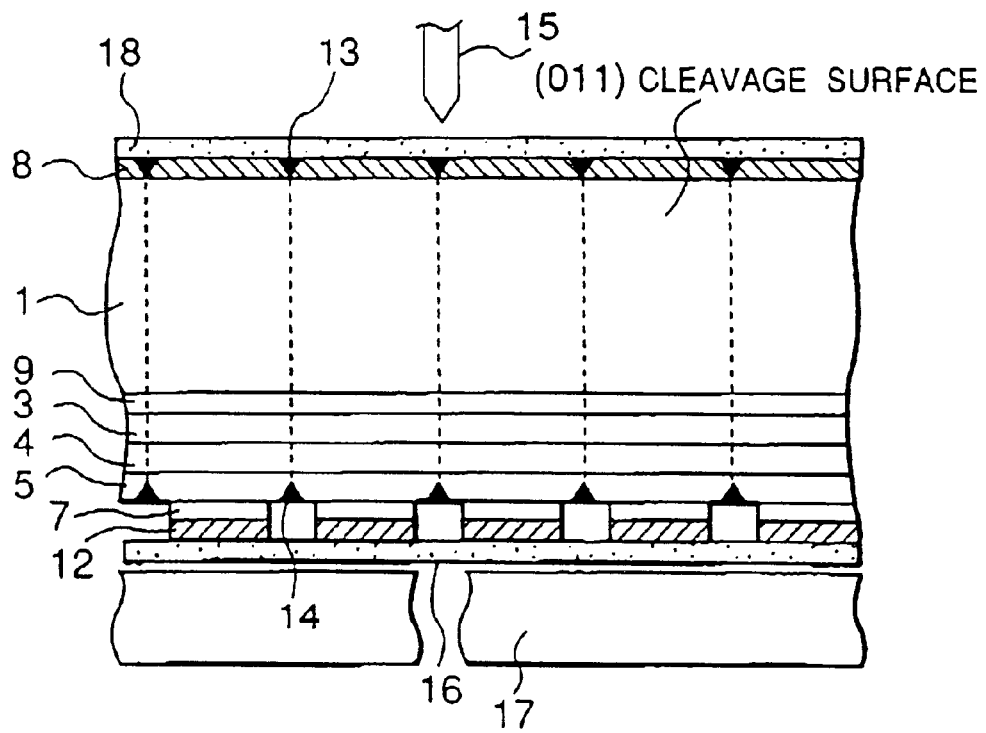

Next, a fifth embodiment will be discussed with reference to FIG. 14.

An n-GaAs buffer layer 9, an n-InGaAlP cladding layer 3, an InGaAlP active layer 4, a p-InGaAlP cladding layer 5, a p-GaAs contact layer 7, are sequentially provided on an n-GaAs substrate 1 inclined at 15° to a surface (100) in a orientation [011]. Thereafter, this n-GaAs substrate surface is mechanically polished with the result that a wafer is finished to have a thickness of 150 μm. Further, AuZn electrodes 12 each having a diameter of 130 μm are provided at a pitch of 250 μm on the p-GaAs contact layer 7 so as to be parallel to an orientation flat formed in an orientation [0/1/11]. [/] denotes an upper bar. Next, an AuGe electrode 8 (a substrate side electrode) is provided over the entire surface on the n-GaAs substrate. In the fifth embodiment, the wafer is partially provided inside with an area formed with no AuGe electrode 8 as a monitor area so that a pattern of the 250 μm pitches at which the AuZn electrodes 12 are arranged can be coincident with the scribing lines on the substrate surface on the tearing-up surface in a scribing process executed afterward when scribing on the substrate surface.

A scribing device, which is employed herein, is manufactured by adding a microscope having an infrared-ray transmitting function so that the AuZn electrode pattern can be aligned with the scribing lines in the area where the above-described AuGe electrode 8 is not provided. This scribing device scribes (forms scribing lines on) the AuGe electrode 8 by applying a load of 14 g on a scribing diamond needle. Thereafter, as a result of implementing a pellet division by applying an external force on the luminous surface opposite to the scribed surface of the wafer, the element separation rate is enhanced up to 90%, and the pellet in a good shape can be obtained. The pellet division is done by pasting adhesive sheets 16, 18 to the principal surface of the luminous surface and to the principal surface of the substrate, placing a pressure plate 17 under the adhesive sheet 18, locating the cutter blade 15 through the adhesive sheet 16 in a position 14 on the cleavage surface in accordance with the scribing line 13 on the InGaAlP cladding layer which line faces to an area where no pressure plate 17 is disposed, and cutting the wafer along the scribing line 13 by applying a force thereon.

Further, if a precision of a finishing dimension of the luminous side (the surface formed with the AuZn electrode 12 is to be enhanced, after executing the scribing process on the AuGe electrode 8, the diamond needle scribes (subscribing process) a position (to form a scribing line 14) with a load of 5 g on the cleavage surface, more specifically, on a surface (011), which position is in a face-to-face relationship with the scribing line 13 on the AuGe electrode 8. Thereafter, the wafer is divided into a pellet by applying the external force upon the scribing line 13 (the method of dividing it by applying the external force is the same as the one explained above).

In the case of being thus divided into the pellet, it is feasible to obtain the pellet which is excellent of the dimensional precision of the luminous surface and of its configuration as well.

The element separation rate can be increased to 90% by utilizing the scribing method in the fifth embodiment in contrast with 70% in the prior art. Furthermore, there is obtained the semiconductor light emitting element exhibiting a high reliability without causing any cracks and chippings of the edge portions of the pellet.

Next, a sixth embodiment will be explained with reference to FIGS. 15A, 15B and 16.

Figure 15A:
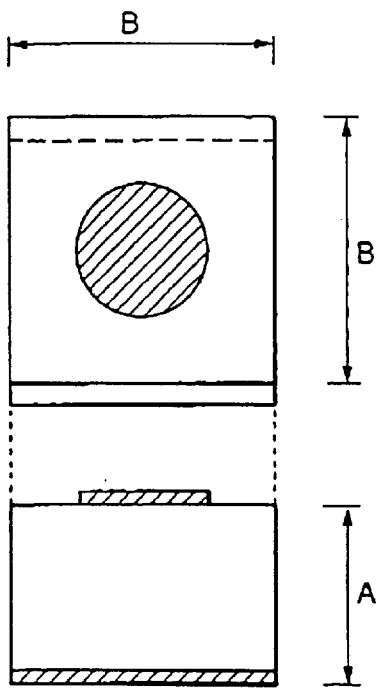
FIGS. 15A–15C are plan view, front view and side view of the semiconductor light emitting element pellet according to the present invention.
Figure 15B:
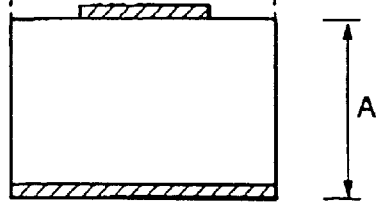
Figure 15C:
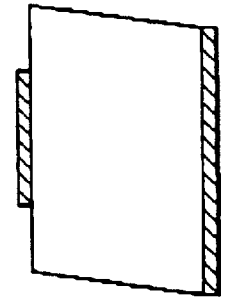
Figure 16:
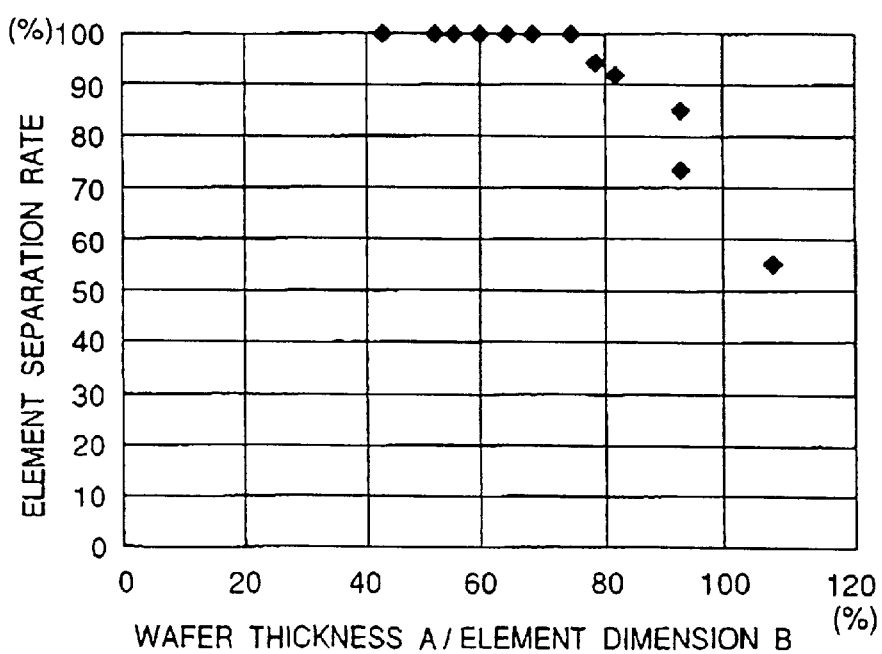
FIG. 16 is an explanatory characteristic diagram showing an element separation rate according to the present invention.

FIGS. 15A, 15B and 15C are plan, front and side views, respectively. FIG. 16 is a characteristic diagram showing a dependency of the element separation rate upon a ratio of a wafer thickness (i.e., a pellet thickness) A to a crosswise dimension B of the pellet. In the sixth embodiment, a structure of the semiconductor light emitting element is substantially the same as the one shown in FIG. 14, and therefore the internal structure thereof is explained referring to FIG. 14.

The n-GaAs buffer layer 9, the n-InGaAlP cladding layer 3, the InGaAlP active layer 4, the p-InGaAlP cladding layer 5, the p-GaAs contact layer 7, are sequentially provided on the n-GaAs substrate 1 inclined at 15° to the surface (100) in the orientation [011]. Thereafter, this n-GaAs substrate surface is mechanically polished.

The wafer thickness to which the wafer is polished and finished at this time must be set so that the ratio of the pellet thickness A to the pellet crosswise dimension B (A/B) is 70% or under (see FIG. 15). When the element is thus structured, as illustrated in FIG. 16, there is obtained the pellet that is neat in its external configuration and exhibits a high element separation rate in the separation process. In accordance with the sixth embodiment, the wafer is polished till the wafer thickness A reaches 130 μm so that the pellet crosswise dimension B should be 200 μm.

Further, the AuZn electrodes 12 each having a diameter of 130 μm are provided at a pitch of 250 μm on the p-GaAs contact layer 7 so as to be parallel to the orientation flat formed in the orientation [0/1/1]. Next, the AuGe electrode 8 (the substrate side electrode) is provided over the entire surface on the n-GaAs substrate. In the sixth embodiment, the wafer is partially provided inside with the area formed with no AuGe electrode 8 as the monitor area so that the pattern of the 250 μm pitches at which the Auzn electrodes 12 are arranged can be coincident with the scribing lines on the substrate surface on the cleavage surface in the scribing process executed afterward when scribing on the substrate surface.

A scribing device, which is employed herein, is manufactured by adding the infrared-ray transmitting function so that the AuZn electrode pattern can be aligned with the scribing lines in the area where the above-described AuGe electrode 8 is not provided. This scribing device scribes (forms the scribing lines on) the AuGe electrode 8 by applying the load of 14 g on the scribe diamond needle. Thereafter, as a result of implementing the pellet division by applying an external force on the p-electrode side of the wafer, the element separation rate is enhanced up to 90%, and the pellet in a good shape can be obtained. The method of effecting the pellet division is the same with the fifth embodiment.

Next, a seventh embodiment will be discussed with reference to FIGS. 17 and 18.

Figure 17:
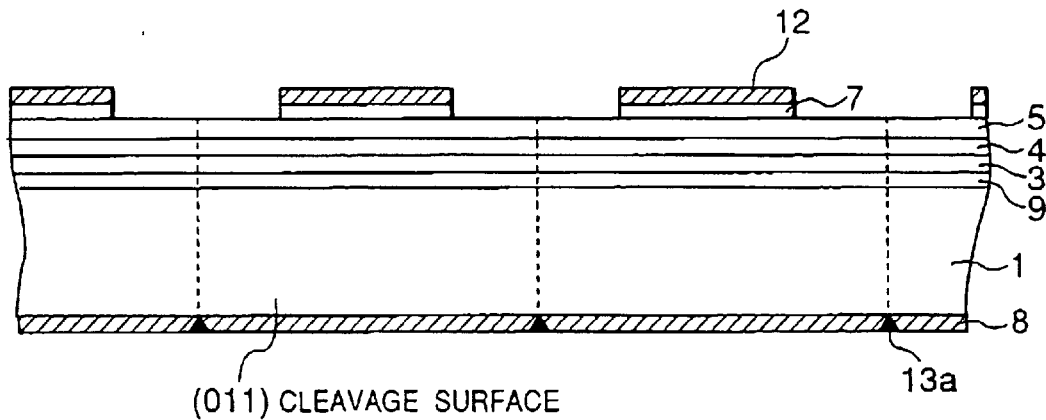
FIG. 17 is an explanatory wafer sectional view showing a method of cutting a wafer according to the present invention.
Figure 18:
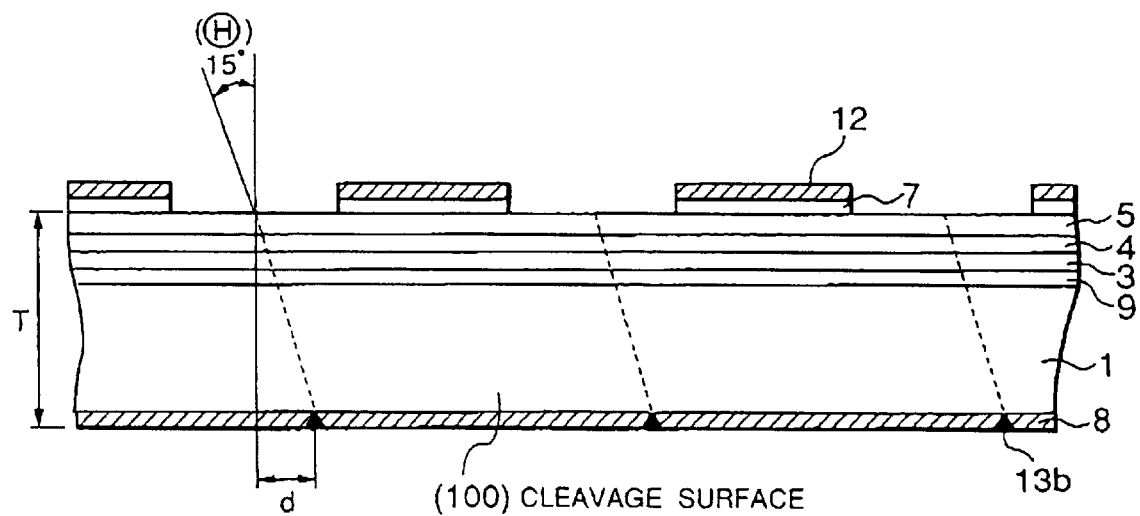
FIG. 18 is an explanatory wafer sectional view showing a method of cutting the wafer according to the present invention.
Figure 19:
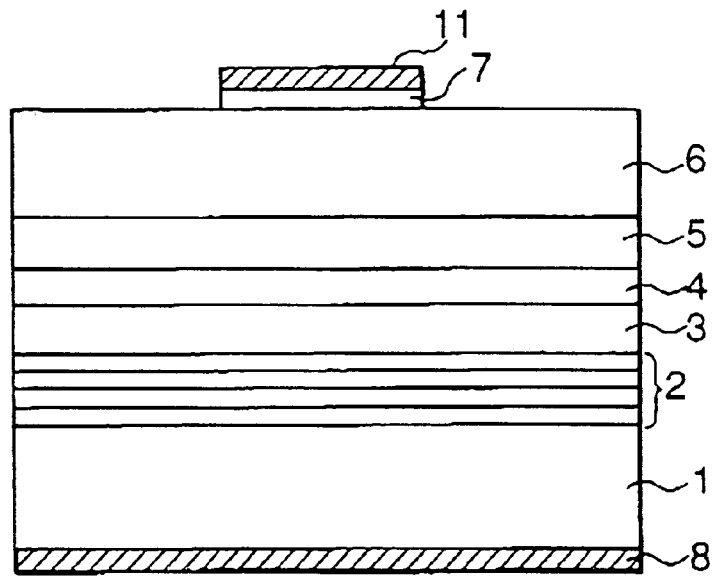
FIG. 19 is a sectional view illustrating a prior art semiconductor light emitting device.
Figure 20:
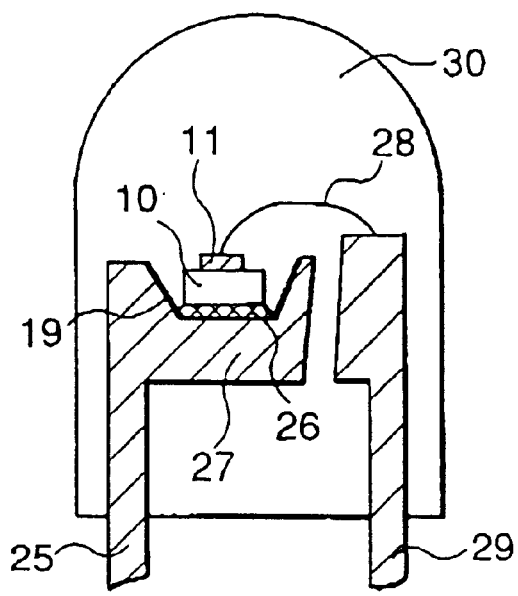
FIG. 20 is a sectional view showing the prior art semiconductor light emitting device.

FIGS. 17 and 18 are sectional views each showing the semiconductor light emitting element. The seventh embodiment is characterized such that when the diamond needle scribes the wafer including the compound semiconductor crystal layers stacked on the semiconductor substrate inclined in the orientation [011] to the surface (100), the diamond needle scribes the semiconductor substrate after an electrode pattern has been previously formed exactly on the upper side of the stacked semiconductor crystalline surface in parallel to the wafer orientation flat on the occasion of forming the electrodes.

The surface (100) is scribed into a pattern, and the surface (011) is scribed with a deviation by a quantity of an OFF angle inclination with respect to a thickness, which quantity is calculated in advance. According to this method, it is possible to obtain the good configuration and the high separation rate in an afterward-executed process of separating the element by applying the external force, and the pellet configuration is good enough to actualize such a separation that the surfaces (100) and (011) are coincident with each other, whereby the semiconductor light emitting element formed neatly along the crystalline surface can be acquired.

The n-GaAs buffer layer 9, the n-InGaLAlP cladding layer 3, the InGaAlP active layer 4, the p-InGaAlP cladding layer 5, the p-GaAs contact layer 7, are sequentially provided on the n-GaAs substrate 1 inclined at 15° to the surface (100) in the orientation [011]. Thereafter, this n-GaAs substrate surface is mechanically polished, thereby finishing the wafer to a thickness on the order of 150 μm.

Next, the AuZn electrodes 12 each having a diameter of 130 μm are arranged at an interval of 250 μm pitches on the p-GaAs contact layer 7 so as to be parallel to the orientation flat (OF) formed in the orientation [011]. Subsequently, the AuGe electrode 8 is provided on the whole surface of the n-GaAs substrate. The scribing device involves the use of upper and lower cameras (double-sided cameras), and hence the wafer is not provided inside with an area where no AuGe electrode is formed. The device of the upper camera system, which is employed herein, is the one to which the infrared-ray transmitting function is added so that the AuZn electrode pattern can be aligned with the scribing lines by providing an area where the above-described AuGe electrode 8 is not provided as a monitor area.

This scribing device scribes (forms scribing lines 13a) the AuGe electrode 8 by applying a load of 14 g on the scribing diamond needle and scribes (forms scribing lines 13b) it by making a rotation through 90°. On this occasion, the scribing process upon the semiconductor substrate involves calculating a deviation quantity d corresponding to an inclined angle (θ) of the wafer pith respect to a distance (a wafer thickness) T from the substrate crystalline surface to the upper side of the semiconductor crystalline surface, and making a movement by the deviation quantity (d) from the center of the pattern interval. Thereafter, as a result of implementing the element separation by applying the external force on the p-electrode of the wafer, the element separation rate is enhanced up to 97%, and the well configured element without chipped edges can be obtained.

The present invention is sufficiently applicable to pellets subjected to mesa and half-dicing processes, which requires calculating the deviation quantity corresponding to the inclination of the wafer with respect to a thickness of the remaining, and making the movement by the deviation quantity from the center of the pattern interval.

Formulae for calculating the deviation quantity are: d=T (wafer thickness) X tan θ, by which to obtain the deviation quantity (d) of the pellet where the mesa and half-dicing processes are not effected upon the luminous layer of the semiconductor light emitting element, and: d=(T−mesa and half-dicing process depth) X tan θ, by which to obtain (d) of the pellet where the mesa and half-dicing processes are effected.

The element separation rate can be enhanced up to 97% by using the diamond scribing method in the sixth embodiment in contrast with approximately 70%, in the prior art. Owing to the scribing lines coincident with the substrate crystalline surface, there must be no possibility of causing any cracks and chippings of the edges of the element and forming any stepped portion in section, and the semiconductor light emitting element having the neat element configuration and exhibiting the high reliability, is obtained.

The present invention has dealt with the embodiments of the semiconductor light emitting element using the InGaAlP group materials, however, materials such as GaAs/GaP, etc. having a light emerging area on the pellet side surface and a GaAlAs/GaAs group material may also be usable with no limit to specific materials.

What is claimed is:

1. A semiconductor light emitting element comprising:
   a luminous surface formed in a perpendicular direction of a pn-junction; and
   two pairs of face-to-face side surfaces;
   wherein one of the two pairs of side surfaces have fixed inclinations in the same direction to the perpendicular direction, and wherein a light emitting direction from said luminous surface deviates from a normal line to said luminous surface.

2. The semiconductor light emitting element according to claim 1, wherein said semiconductor substrate has a principal surface inclined at 5° through 20° in an orientation [011] to a surface (100), and said luminous layer is grown on said principal surface.

3. The semiconductor light emitting element according to claims 1, wherein at least two side surfaces of said semiconductor light emitting element are formed with stepped portions.

4. The semiconductor light emitting element according to claim 1, wherein said element has a rectangular plane configuration having two longer sides and two shorter sides, and an electrode is provided adjacent one of said shorter sides on an upper surface of said rectangular plane.

5. A semiconductor light emitting element comprising:
   a semiconductor substrate;
   a luminous surface on a luminous layer including an active layer having a pn-junction that is grown on said semiconductor substrate; and
   an electrode provided on said luminous surface of said luminous layer,
   wherein said luminous surface is formed in a perpendicular direction to said pn-junction, face-to-face side surfaces have fixed inclinations in the same direction to the perpendicular direction, and a light emitting direction from said luminous surface deviates from the normal direction to said luminous surface.

6. The semiconductor light emitting element according to claim 5, wherein said semiconductor substrate has a principal surface inclined at 5° through 20° in an orientation [011] to a surface (100), and said luminous layer is grown on said principal surface.

7. The semiconductor light emitting element according to claims 5, wherein at least two side surfaces of said semiconductor light emitting element are formed with stepped portions.

8. The semiconductor light emitting element according to claim 5, wherein said element has a rectangular plane configuration having two longer sides and two shorter sides, and an electrode is provided adjacent one of said shorter sides on an upper surface of said rectangular plane.

9. A semiconductor light emitting device comprising:
   a semiconductor light emitting element having a luminous surface formed in a perpendicular direction of a pn-junction; two pairs of face-to-face side surfaces; one of the two pairs of side surfaces having fixed inclinations in the same direction to the perpendicular direction, and a light emitting direction from said luminous surface deviating from a normal line to said luminous surface,
   an insulating substrate having a pair of electrode conductors including an electrode member provided on a principal surface and a conductive member extending from said electrode member to a rear surface;
   a bonding wire for electrically connecting a light emitting side electrode of said semiconductor light emitting element to said electrode member of said pair of electrode conductors; and
   a resin molded sealing member for sealing said semiconductor light emitting element, said electrode member and said bonding wire,
   wherein a luminous surface formed with said light emitting side electrode of said semiconductor light emitting element takes a rectangular shape, and said light emitting side electrode is disposed in a position separated from said electrode member electrically connected to said bonding wire on said rectangular luminous surface.

10. A semiconductor light emitting device comprising:
    a semiconductor light emitting element having a semiconductor substrate; a luminous layer including an active layer having a pn-junction that is grown on said semiconductor substrate; and an electrode provided on said luminous surface of said luminous layer, said luminous surface being formed in a perpendicular direction to said pn-junction, face-to-face side surfaces have fixed inclinations in the same direction to the perpendicular direction, and a light emitting direction from said luminous surface deviates from the normal direction to said luminous surface, an insulating substrate having a pair of electrode conductors including an electrode member provided on a principal surface and a conductive member extending from said electrode member to a rear surface;

a bonding wire for electrically connecting a light emitting side electrode of said semiconductor light emitting element to said electrode member of said pair of electrode conductors; and a resin molded sealing member for sealing said semiconductor light emitting element, said electrode member and said bonding wire, wherein a luminous surface formed with said light emitting side electrode of said semiconductor light emitting element takes a rectangular shape, and said light emitting side electrode is disposed in a position separated from said electrode member electrically connected to said bonding wire on said rectangular luminous surface.

11. A semiconductor light emitting device comprising:

a semiconductor light emitting element having a luminous surface formed in a perpendicular direction of a pn-junction; two pairs of face-to-face side surfaces; one of the two pairs of side surfaces having fixed inclinations in the same direction to the perpendicular direction, and a light emitting direction from said luminous surface deviating from a normal line to said luminous surface, a bed member for supporting and fixing said semiconductor light emitting element;

a bowl-like reflector formed in the periphery of said bed member;

a first lead connected to said bed member;

a second lead;

a bonding wire for electrically connecting an electrode of said semiconductor light emitting element to said second lead; and a resin molded sealing member for sealing said semiconductor light emitting element, at least part of said first and second leads, and said bonding wire, wherein said semiconductor light emitting element is a scribed pellet manufactured by scribing and cutting a wafer, a principal surface, on a substrate side, of said scribed pellet is mounted on said bed member, and an inclining direction of said one of the two pairs of side surfaces is parallel to a direction in which said bonding wire extends from said pellet so as to be bonded to said lead.

12. A semiconductor light emitting device comprising:

a semiconductor light emitting element having a semiconductor substrate; a luminous layer including an active layer having a pn-junction that is grown on said semiconductor substrate; and an electrode provided on said luminous surface of said luminous layer, said luminous surface being formed in a perpendicular direction to said pn-junction, face-to-face side surfaces have fixed inclinations in the same direction to the perpendicular direction, and a light emitting direction from said luminous surface deviates from the normal direction to said luminous surface, a bed member for supporting and fixing said semiconductor light emitting element;

a bowl-like reflector formed in the periphery of said bed member;

a first lead connected to said bed member;

a second lead;

a bonding wire for electrically connecting an electrode of said semiconductor light emitting element to said second lead; and a resin molded sealing member for sealing said semiconductor light emitting element, at least part of said first and second leads, and said bonding wire, wherein said semiconductor light emitting element is a scribed pellet manufactured by scribing and cutting a wafer, a principal surface, on a substrate side, of said scribed pellet is mounted on said bed member, and an inclining direction of said one of the two pairs of side surfaces is parallel to a direction in which said bonding wire extends from said pellet so as to be bonded to said lead.

* * * * *